US008944832B1

(12) United States Patent
Kerrigan et al.

(10) Patent No.: US 8,944,832 B1
(45) Date of Patent: Feb. 3, 2015

(54) APPARATUS TO INTERCONNECT ORTHOGONAL CIRCUIT BOARDS FOR HIGH DATA RATE USE

(71) Applicant: International Business Machines Corporation, Armonk, NY (US)

(72) Inventors: Brian M. Kerrigan, Cary, NC (US); Robert M. Lindsay, Raleigh, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 36 days.

(21) Appl. No.: 14/016,356

(22) Filed: Sep. 3, 2013

Related U.S. Application Data

(63) Continuation of application No. 14/014,984, filed on Aug. 30, 2013.

(51) Int. Cl.
*H01R 13/62* (2006.01)
*H01R 43/20* (2006.01)
*H01R 43/26* (2006.01)

(52) U.S. Cl.
CPC .............. *H01R 43/205* (2013.01); *H01R 43/26* (2013.01)
USPC ............................ 439/157; 361/788; 361/802

(58) Field of Classification Search
USPC .......... 361/756–759, 800–802, 788; 439/157, 439/159, 160
See application file for complete search history.

(56) References Cited

U.S. PATENT DOCUMENTS

| | | | |
|---|---|---|---|
| 3,827,374 A | 8/1974 | Winsor | |
| 4,427,243 A | 1/1984 | Miller | |
| 5,068,601 A | 11/1991 | Parmenter | |
| 5,201,665 A | 4/1993 | McCardell, Jr. et al. | |
| 5,291,368 A | 3/1994 | Conroy-Wass | |
| 7,241,264 B2 | 7/2007 | Xiao et al. | |
| 7,347,720 B2 | 3/2008 | Takashita | |
| 7,789,669 B1 | 9/2010 | Duesterhoeft et al. | |
| 7,794,233 B1 | 9/2010 | Millard et al. | |
| 8,215,964 B2 | 7/2012 | Hamner et al. | |
| 8,282,290 B2 | 10/2012 | Mulfinger et al. | |
| 2004/0264123 A1* | 12/2004 | Kerrigan et al. ............... | 361/686 |
| 2012/0237166 A1 | 9/2012 | Nichols | |
| 2013/0018505 A1 | 1/2013 | Barrett et al. | |
| 2014/0307400 A1* | 10/2014 | French, Jr. .................... | 361/755 |

* cited by examiner

*Primary Examiner* — Gary Paumen
(74) *Attorney, Agent, or Firm* — Katherine S. Brown; Jeffrey L. Streets

(57) ABSTRACT

A method includes securing a midplane in a chassis, wherein the midplane has one or more connectors, and securing a circuit board in a module, wherein the circuit board has one or more connectors secured along a leading edge of the circuit board for selectively connecting with the one or more connector on the midplane. The method further includes positioning the module so that the circuit board within the module is orthogonal to the midplane, and manually actuating a handle from an unlatched position to a latched position to rotate a cam plate and cause a cam surface of the cam plate to pull the circuit board toward the midplane and connect the one or more connector on the circuit board with the one or more connector on the midplane.

7 Claims, 11 Drawing Sheets

APPARATUS TO INTERCONNECT ORTHOGONAL CIRCUIT BOARDS FOR HIGH DATA RATE USE

CROSS-REFERENCE TO RELATED APPLICATIONS

This application in a continuation co-pending U.S. patent application Ser. No. 14/014,984, filed on Aug. 30, 2013.

BACKGROUND

1. Field of the Invention

The present invention relates to orthogonal circuit board connections.

2. Background of the Related Art

In high performance computer systems with high data rates, there is both an architectural and a performance benefit achieved from the use of orthogonally connected circuit boards. The architectural benefit comes from the fact that electrical interconnection between all or any subset of the boards can be obtained without the need to connect through copper circuit trace paths like traditional mid plane system architectures. Instead, an orthogonal system can be structured such that a matrix of boards can be constructed using a network of minimum length direct connected pathways solely through the connector itself using mid plane connector vias. This advantage can be leveraged to design a system analogous to a high performance switch to control data and processing networks. The advantage of this system flexibility in interconnection lends itself nicely to highly networked hardware and cloud computing goals.

The second benefit to orthogonal connection comes from a signal quality performance standpoint. Orthogonal connections provide system designers the ability to eliminate traditional copper circuit paths normally used on present mid plane designs. Orthogonal connections instead utilize a common (shared via) copper plated via hole wherein the connectors themselves are press fit into common via holes from oppose sides of the mid plane.

The advantage of this "shared via" technology is that circuit path lengths are very short and are directly coupled through each respective orthogonal connector pair. Mid plane circuit traces are therefore eliminated, signals pass through vias but do not get distributed onto the mid plane. This greatly improves high speed signal quality and allows increased network data rates, due to the resultant enhanced electrical signal quality.

BRIEF SUMMARY

One embodiment of the present invention provides a method, comprising: securing a midplane in a chassis, wherein the midplane has one or more connectors; securing a circuit board in a module, wherein the circuit board has one or more connectors secured along a leading edge of the circuit board for selectively connecting with the one or more connector on the midplane; positioning the module so that the circuit board within the module is orthogonal to the midplane; and manually actuating a handle from the unlatched position to the latched position to rotate a cam plate and cause a cam surface of the cam plate to pull the circuit board toward the midplane and connect the one or more connector on the circuit board with the one or more connector on the midplane.

DETAILED DESCRIPTION

Figure 1:
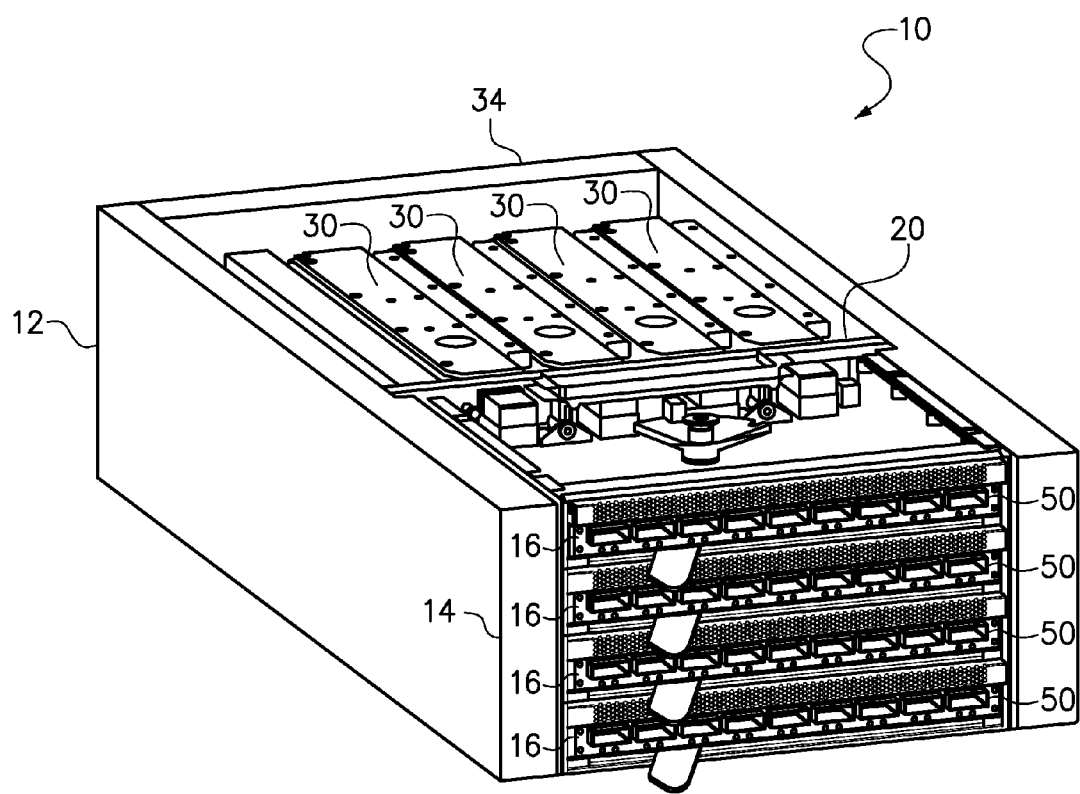
FIG. 1 is a perspective view of a chassis having a midplane and a plurality of orthogonal modules coupled to each side of the midplane.

One embodiment of the present invention provides an apparatus, comprising a chassis securing a midplane and forming a bay orthogonally aligned with the midplane, wherein the midplane is a circuit board including one or more connectors aligned with the bay, and a latch arm fixedly coupled to the midplane and extending into the bay. The apparatus further comprises a module securing a circuit board and being slidably receivable with the bay, wherein the circuit board has one or more connectors secured along a leading edge of the circuit board for connection with the one or more connectors on the midplane that are aligned with the bay. A handle includes a proximal link and a distal link, wherein the proximal link is pivotally coupled to the module about a pivot axis that is orthogonal to the module, and wherein the distal link is pivotally coupled to the proximal link and has a distal end extending beyond an edge of the module for manual actuation of the handle between an unlatched position and a latched position. The distal link and the proximal link are further coupled by a spring for transmitting a controlled amount of torque from the distal link to the proximal link when the handle is moved toward the latched position. A cam plate is secured for rotation with the proximal link, wherein the cam plate includes a cam surface for engaging the latch arm. Still further, an over-center spring has a first end coupled to the module and a second end coupled to the proximal link, wherein the over-center spring opposes rotation of the cam plate through a first range of rotation of the cam plate and contributes to rotation of the cam plate through a second range of rotation of the cam plate. Manual actuation of the handle from the unlatched position to the latched position causes a cam surface of the cam plate to pull the circuit board toward the midplane and connect the one or more connector on the circuit board with the one or more connector on the midplane.

The midplane is a circuit board that provides electronic communication between components on either side of the midplane without relying upon cables. The electronic communication is provided by one or more connectors on each side of the midplane. Embodiments of the present invention are compatible with midplanes having opposing connectors directly electronically coupled through a via barrel, rather than involving conductive traces. For example, the midplane may include one or more connectors on a first side of the midplane and one or more connectors on a second side of the midplane, and wherein each connector of the first side shares a common via with one of the connectors on the second side.

One embodiment of the midplane enables high quality signals in systems of 25 to 40 GB and higher data rates. The midplane may include connectors having minimal length pins within an orthogonal connector body and foreshortened via barrels to minimize reflections and signal cross talk. In one example, the pin length within a connector is 4.5 mm or less. Furthermore, the connector on the midplane and a connector on a module circuit board may have a wipe of only about 1 mm or less. Embodiments of the present invention are able to accommodate orthogonal connections on both sides of the midplane despite the short connector pins and a thin and structurally weak mid plane (which accommodates short via barrels).

The chassis provides a rigid housing for securing the midplane and various orthogonal modules or other components coupled to the midplane. The chassis typically includes first and second opposing ends that are open for receiving the midplane, modules and other components. In one non-limiting example, the midplane may be secured to a shuttle and then the shuttle may be inserted and secured within the chassis. A shuttle is useful for dealing with very small dimensional tolerances. In certain embodiments discloses herein, components may be coupled to the midplane and secured within the shuttle with dimensional certainty that the midplane is secured at the end of the shuttle. The modules installed in the chassis opposite the shuttle may be self-registered to the midplane using the cam mechanism disclosed herein.

The chassis may form a plurality of bays that are accessible from one of the open ends of the chassis. Each bay is preferably orthogonal to the midplane and guides a module into an operable position relative to the midplane.

A module receives and secures a circuit board for installation into the chassis. A preferred module has a rigid structure that includes opposing side rails that extend outwardly to be slidably received within mating grooves formed in the opposing sides of the chassis.

In one specific example, the midplane may contain a 4×4 orthogonal array of connectors on each side of the midplane (16 connector pairs). Such an array may, for example, span a 380 mm wide×185 mm high area of the midplane circuit board. Accordingly, the chassis may form four bays, where each bay spans one row of the connectors. A module securing a circuit board with four connectors may be inserted in any of the four bays and latched in an operable position with the four connectors coupled to the four midplane connectors.

The latch arm and the pivot axis of the cam plate are preferably centered among the connectors on the midplane, so that the connecting force formed between the cam plate and the latch arm is evenly distributed across the connectors. It is also preferably for the cam plate and the handle to be disposed on opposite sides of the circuit board and coupled by a pivot pin that defines the pivot axis. With the cam plate and the handle on opposite sides of the circuit board, it is easier to accommodate the interaction of the cam plate with the latch arm on one side and accommodate the over-center spring on the opposite side.

Embodiments of the handle may include a distal link having a limited range of rotation relative to the proximal link. For example, the distal link may engage a stop element on the proximal link. Most preferably, the distal link and proximal link have a pin and arced slot arrangement that limit the rotation of the distal link relative to the proximal link in either the rotational direction.

Another embodiment of the present invention provides a method, comprising: securing a midplane in a chassis, wherein the midplane has one or more connectors; securing a circuit board in a module, wherein the circuit board has one or more connectors secured along a leading edge of the circuit board for selectively connecting with the one or more connector on the midplane; positioning the module so that the circuit board within the module is orthogonal to the midplane; and manually actuating a handle from the unlatched position to the latched position to rotate a cam plate and cause a cam surface of the cam plate to pull the circuit board toward the midplane and connect the one or more connector on the circuit board with the one or more connector on the midplane.

The method may further comprise fixedly coupling a latch arm to the midplane so that the latch arm extends toward the cam plate. Optionally, the latch arm may be part of a bracket that is fixedly coupled to the midplane at multiple points across the midplane, such as with screws. For example, a single bracket might include four latch arms, each latch arm being used to secure one module. Furthermore, the bracket may add rigidity and support to the midplane.

Separately, the handle may include a proximal link and a distal link, such that the method may further comprise pivoting the distal link about a pivot coupling with the proximal link, controlling the amount of torque transmitted from the distal link to the proximal link using a spring, and pivoting the proximal link about a pivot axis orthogonal to the module to cause rotation of the cam plate.

In a preferred embodiment, moving the handle to the latched position causes the over-center spring to bias the cam plate toward the latched position, and releasing the handle after moving the handle to the latched position leaves only the over-center spring biasing the cam plate toward the latched position. Most preferably, the handle may be manually actuated by moving a distal end of the handle, wherein the distal end extends beyond an edge of the module.

In another embodiment, the method further comprises orthogonally coupling other circuit boards to a second side of the midplane. It should be recognized that the other circuit boards may be secured in the same manner, or in a different, as disclosed herein.

Once the modules are installed and the cam plate has been actuated so that the connectors on the circuit board are coupled to the midplane connectors, the method may include transmitting signals through the connectors at a data rate between 25 and 40 gigabits per second or greater.

Certain apparatus and method embodiments of the present invention may provide one or more of the following benefits: elimination of typical handle and chassis tolerances, gaps and flexure from mating tolerance stack; symmetrical application of a load force in line with the connectors; elimination of staggered screw tightening sequence; and mating of connectors with a controlled load that is relaxed to meet the structural tolerance of the midplane.

FIG. 1 is a perspective view of a chassis 10 having a midplane 20 and a plurality of orthogonal modules 50 and other components 30 coupled to each side of the midplane. A top of the chassis 10 has been removed to show what is inside the chassis. In the embodiment shown, the midplane 20 is secured to a shuttle 34 that is inserted through an open first end 12 of the chassis and secured within the chassis 10. The chassis 10 also forms a plurality of bays 16, each bay capable of receiving one of the modules 50.

Figure 2:
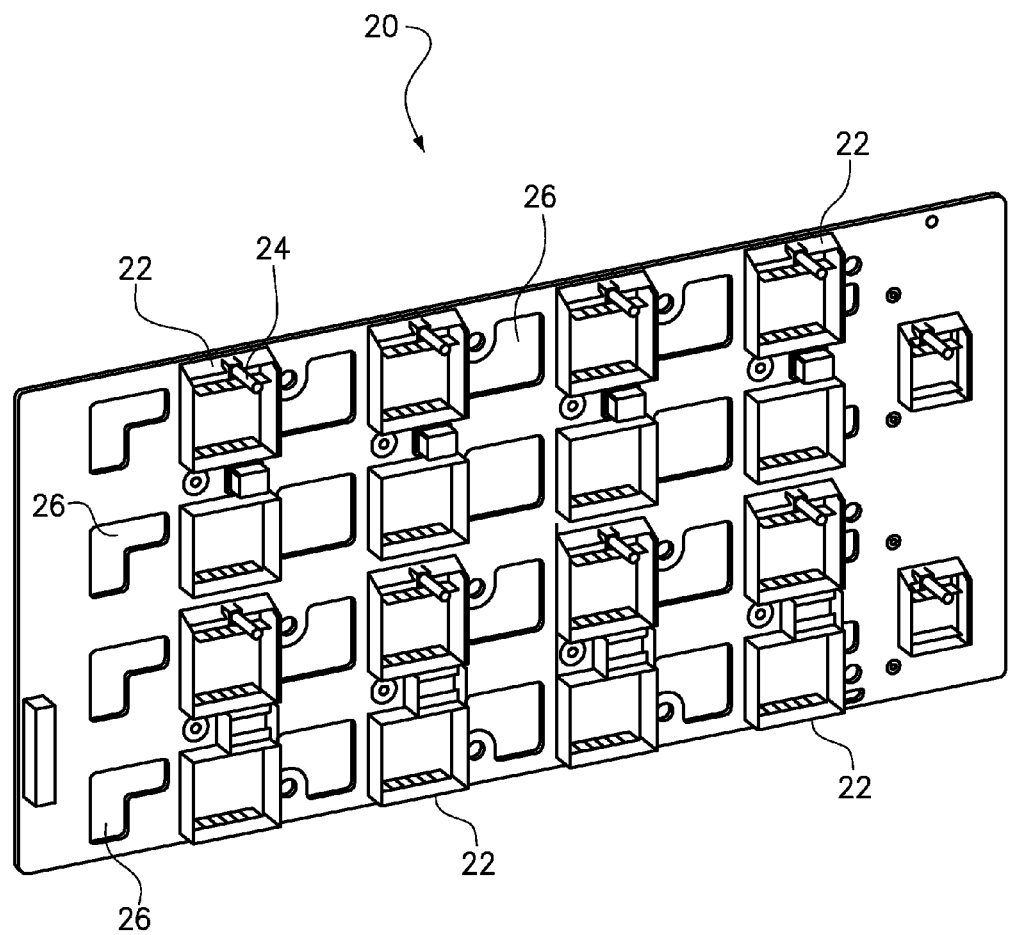
FIG. 2 is a perspective view of the midplane.

FIG. 2 is a perspective view of the midplane 20. As shown in this embodiment, the midplane has 16 connector pairs, including 16 connectors 22 on a first side of the midplane (shown) and another 16 connectors on a second side of the midplane (not shown). This 4×4 orthogonal array of connectors spans an area of the midplane that is 380 mm wide and 185 mm high. The midplane may, for example, be about 3.2 mm thick. Accordingly, the midplane may, for example, be coupled to four orthogonal circuit boards (not shown), where each orthogonal circuit board has four connectors that couple to one row of the connectors on the midplane. Each connector 22 is shown with pin 24 that assists in aligning the connector 22 with a mating connector on an orthogonal circuit board (shown in FIG. 4). The midplane may also include air passageways 26 that allow airflow to pass through the midplane 20 so that modules or component on each side of the midplane may be cooled.

The connectors may be, for example, a MOLEX® IMPEL™ orthogonal midplane or backplane connector (available from Molex Inc. of Lisle, Ill.). The midplane connectors may be of the pin header style where both sides of the midplane share vias for the connectors. A connector pair has two connectors that are on opposite sides of the midplane and the pins from the two connectors share common vias. The connector pin lengths are about half the width of the midplane thickness to enable pins from the two opposing connectors to fit into the same via barrel (hole) in the midplane.

Figure 3:
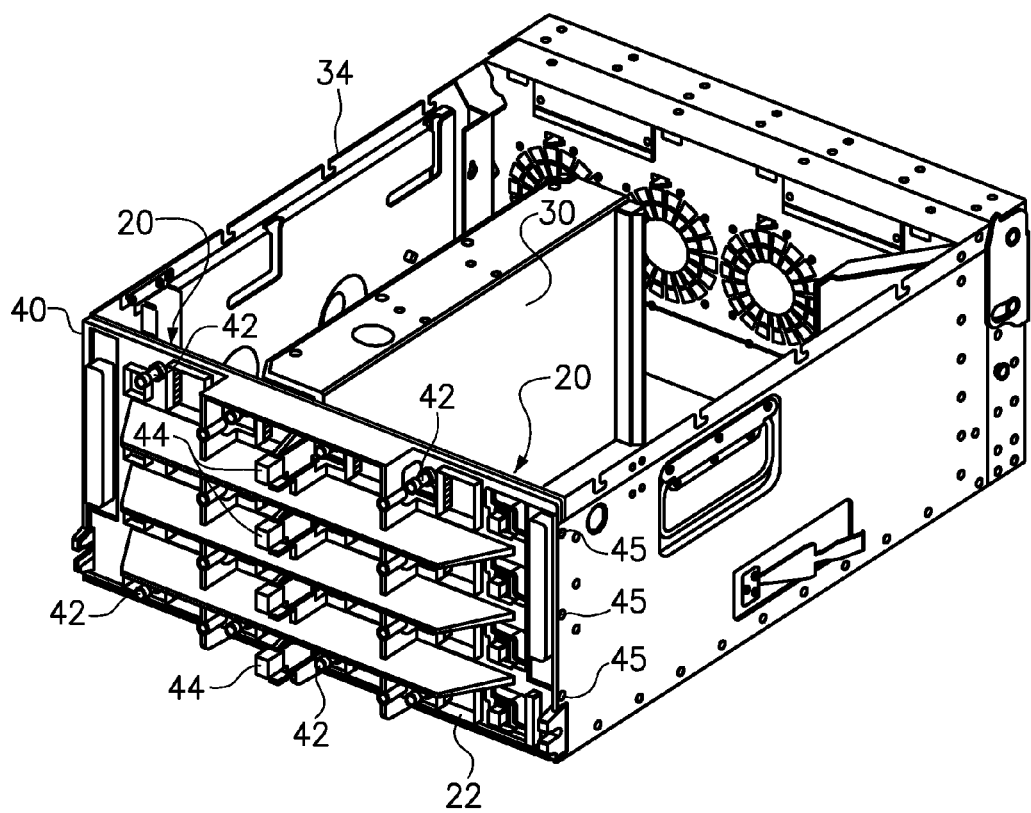
FIG. 3 is a perspective view of a shuttle that secures the midplane.

FIG. 3 is a perspective view of a shuttle 34 that secures the midplane 20. The shuttle 34 includes orthogonal components 30 that are secured to the shuttle for electronic communication with the midplane 20. This particular shuttle 34 further includes a fan module that will be used to draw air through the chassis 10 (See FIG. 1) after the shuttle is installed in the chassis. Once loaded, the shuttle is secured into the chassis.

The midplane 20 is obscured from view by a bracket 40 that is secured to the midplane 20 with 16 screws 42 distributed across the area of the midplane. The bracket 40 may provide support and rigidity to the midplane 20, but also supports the latch arms 44. Each of four rows of connectors 22 has a latch arm 44 for coupling an orthogonal circuit board in a module. Optionally, the bracket 40 may be directly secured to the shuttle 34, such as with fasteners 45 around the edges of the bracket.

Figure 4:
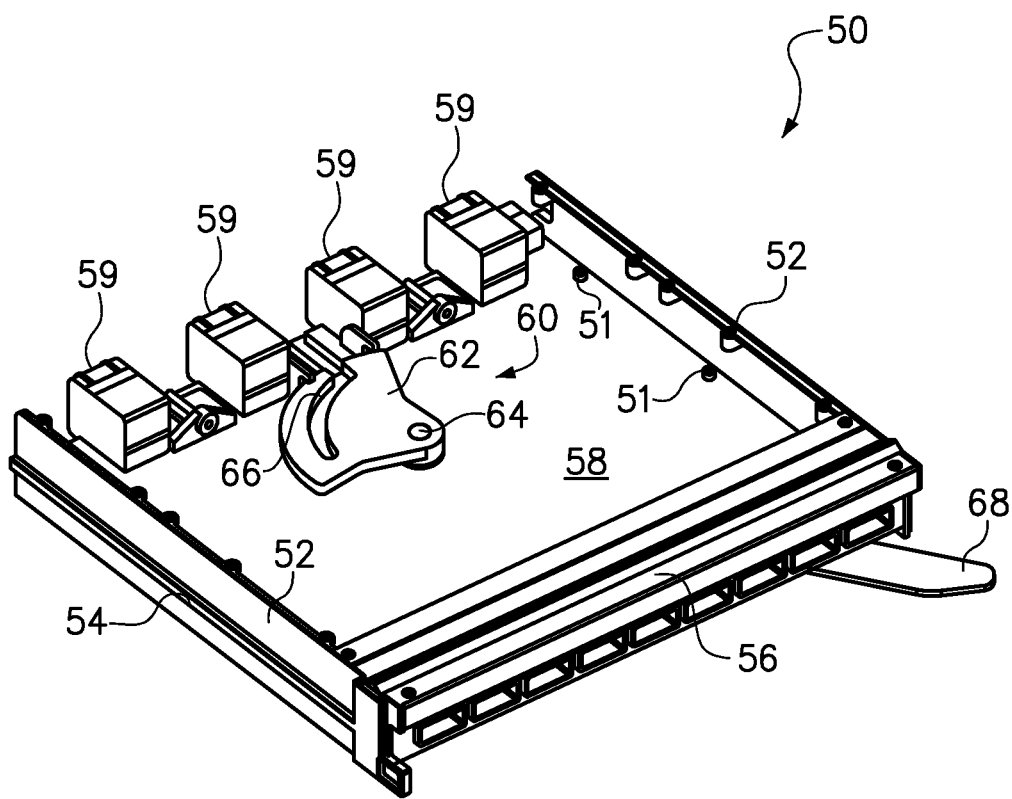
FIG. 4 is a perspective view of an orthogonal module having a rotary cam latch in an unlatched position.

FIG. 4 is a perspective view of an orthogonal module 50 having a rotary cam latch 60 in an unlatched position. The module 50 has a rigid structure including two sidewalls 52 that each form a rail 54 for sliding the module into a bay 16 (See FIG. 1) of the chassis. An external face 56 includes a grill that allows air to flow therethrough. A circuit board 58 is secured with the module 50, such as with screws 51 around the edges of the circuit board 58. The circuit board 58 will include various circuits and components (not shown) that rely upon a reliable connection through the connectors 59 on the leading edge of the circuit board. In accordance with one embodiment of the invention, the connectors 59 will be coupled to the connectors 22 (not shown) on the midplane.

The rotary cam latch 60 is used to pull the circuit board 58 toward the midplane until the connectors 59 are operably coupled to the connectors 22 (not shown) on the midplane. The rotary cam latch 60 includes a cam plate 62 that pivotally secured to the module 50 about a pivot axis 64, such as extending through the circuit board 58. A cam surface 66 is formed in the cam plate 62 for engaging a latch arm (see latch arm 44 of FIG. 3). The rotary cam latch 60 is manually rotated using a handle 68 that extends beyond the module for accessibility. The nature of the connection between the handle 68 and the cam plate 62 will be described in greater detail in reference to FIGS. 7A-7E.

Figure 5:
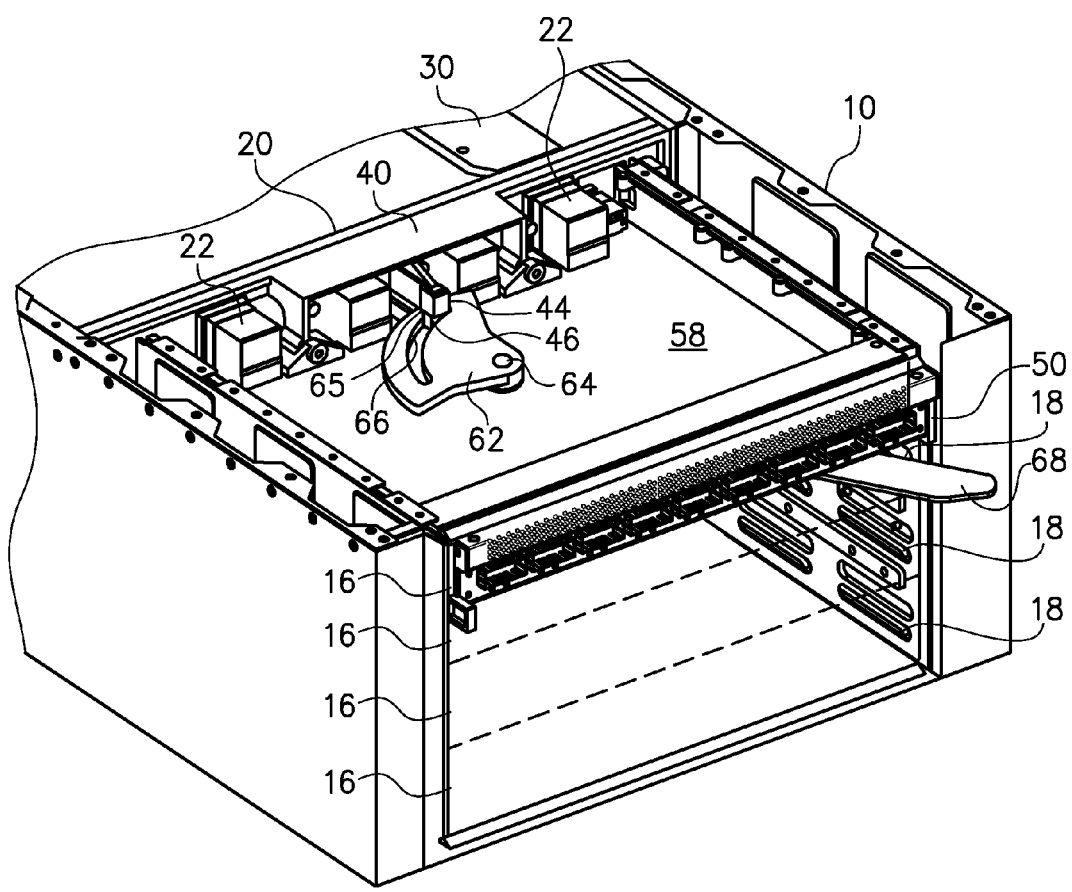
FIG. 5 is a perspective view of the orthogonal module received in a bay of the chassis and aligned with the midplane.

FIG. 5 is a perspective view of the orthogonal module 50 received in the uppermost bay 16 (out of four bays 16) of the chassis 10 and aligned with the top row of connectors 22 on the midplane 20. The side rails 54 (see FIG. 4) of the module 50 slide into and along a track 18 (see the tracks 18 of the lower three bays 16). Accordingly, the module 50, and therefore the circuit board 58 is able to freely move toward and away from the midplane 20.

With the handle 68 in the unlatched position as shown, an entry slot 65 in the cam plate 62 is directed for receiving a pin 46 (downwardly extending, as shown) on the end of the latch arm 44. The pin 46 is therefore aligned for engaging the cam surface 66 as the cam plate 62 is rotated clockwise (as shown) about the pivot axis 64.

Figure 6:
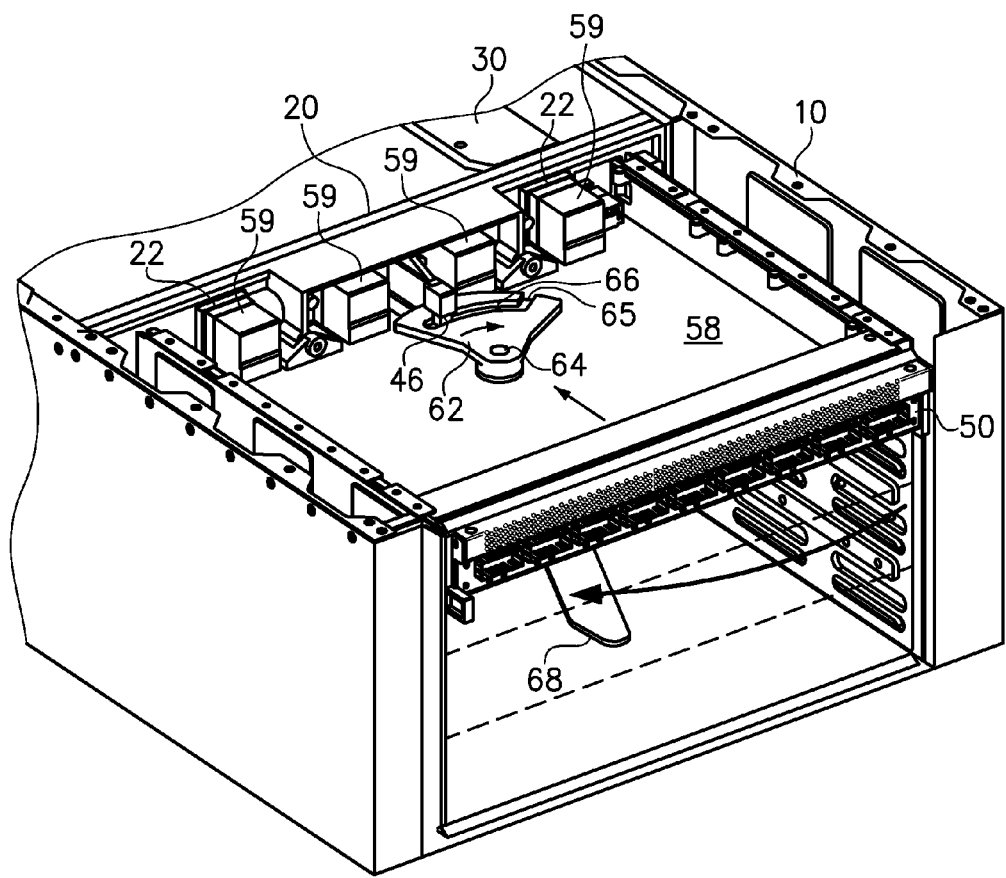
FIG. 6 is a perspective view of the orthogonal module latched with its connectors connected to the midplane connectors.

FIG. 6 is a perspective view of the orthogonal module 50 latched with its four connectors 59 connected to the four midplane connectors 22. The handle 68 has been moved to the left (as shown in FIG. 6), causing the cam plate 62 to have rotated clockwise about the pivot axis 64. As the cam plate pivots, the pin 46 on the end of the latch arm 44 has slid along the cam surface 66. As the cam plate rotates clockwise, the portion of the cam surface 66 that engages the fixed latch arm pin 46 gets gradually closer and closer (a smaller radial distance) to the pivot axis 64. Since the latch arm pin 46 is fixedly coupled to the midplane 20, the decreasing radial distance from the latch arm pin 46 to the pivot axis 64 serves to pull the module 50 and the circuit board 58 toward the midplane 20. The amount of rotation of the cam plate 62 determines the amount of force that is used to makeup or complete the connections between the aligned connectors 22, 59. The pin 46 and the cam surface 66 are preferably smooth to allow for easy sliding there between.

FIGS. 7A-7E provide a series of perspective views of a handle mechanism 70 that actuates the rotary cam latch 60 (see FIGS. 4-6). The module 50 has been turned upside down relative to FIG. 4. For perspective, the module 50 is shown with rails 54 on each of the sides 52 and the grill (EMI shield) on the other side 56. A leading end of the circuit board 58 can be seen, as well as an edge of the four connectors 59. However, much of the circuit board 58 cannot be seen, because the module has a rigid base 53 that extends between the sides 52.

Figure 7A:
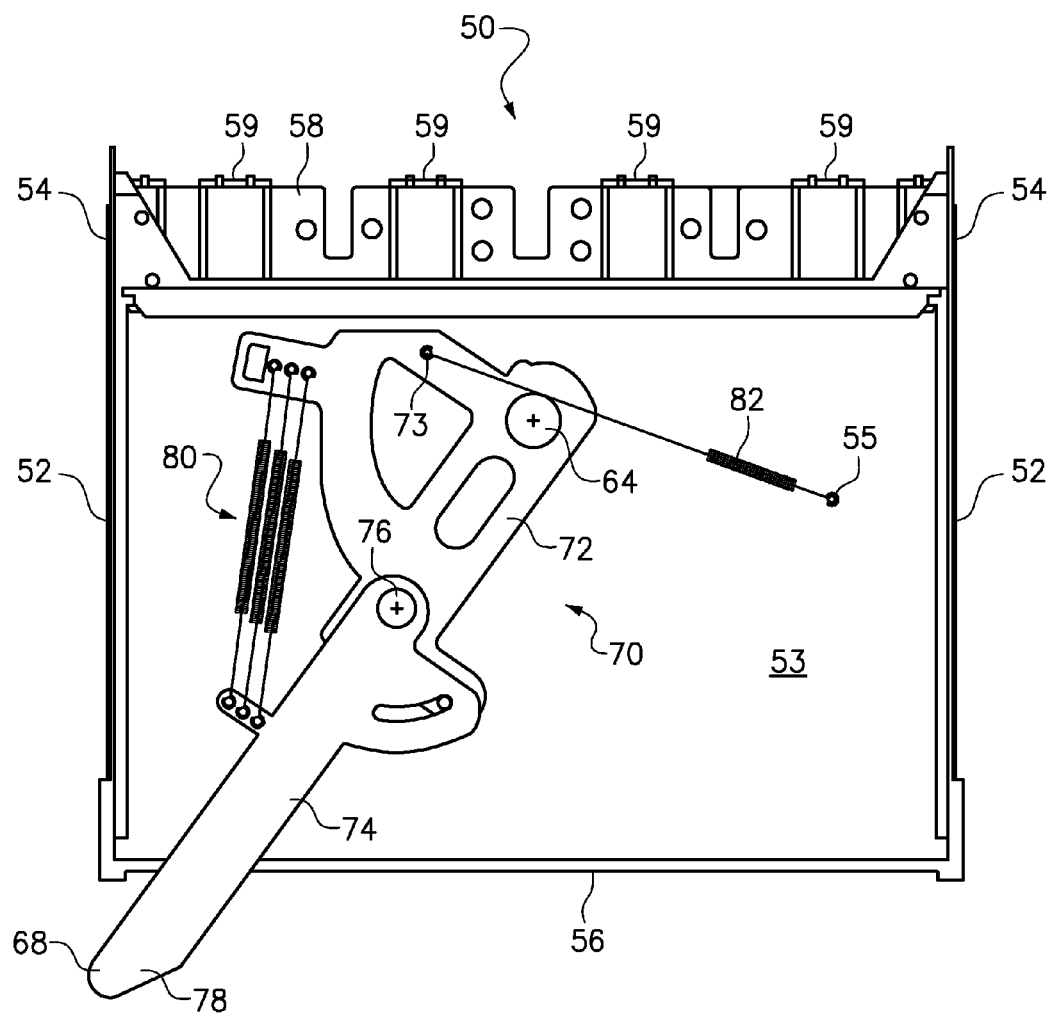
FIGS. 7A-7E a series of perspective views of a handle mechanism that actuates the rotary cam latch.

In reference to FIG. 7A, the handle 68 is shown to include a proximal link 72 and a distal link 74 (proximal and distal relating to the distance from the pivot axis 64). The proximal link 72 is pivotally coupled to the module 50 about the pivot axis 64 that is orthogonal to the module. This is the same pivot axis 64 as shown in FIGS. 4-6. Furthermore, the cam plate 62 (shown in FIGS. 4-6) is secured for rotation with the proximal link 64, such that any rotation of the proximal link causes the cam plate to experience an equal amount of rotation and any torque applied to the proximal link is transmitted to the cam plate.

Figure 7B:
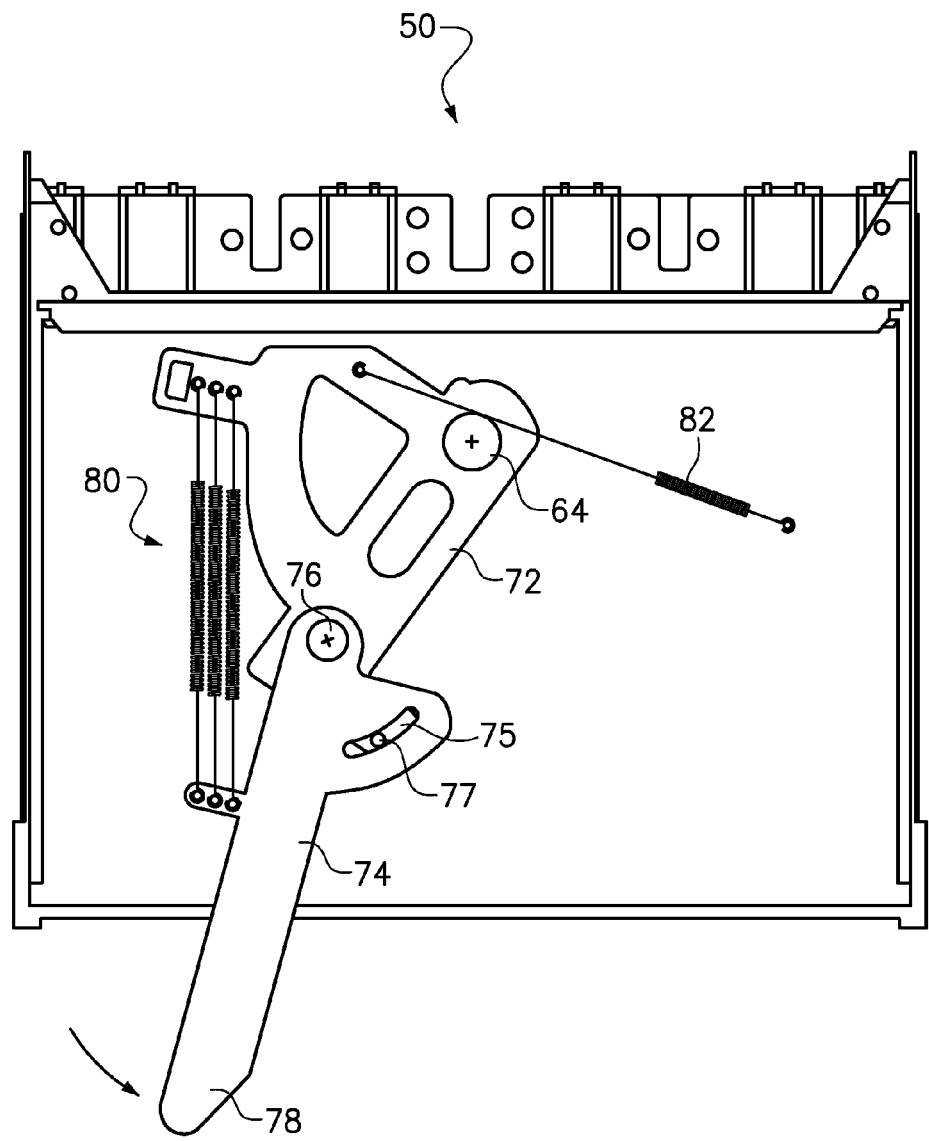
Figure 7C:
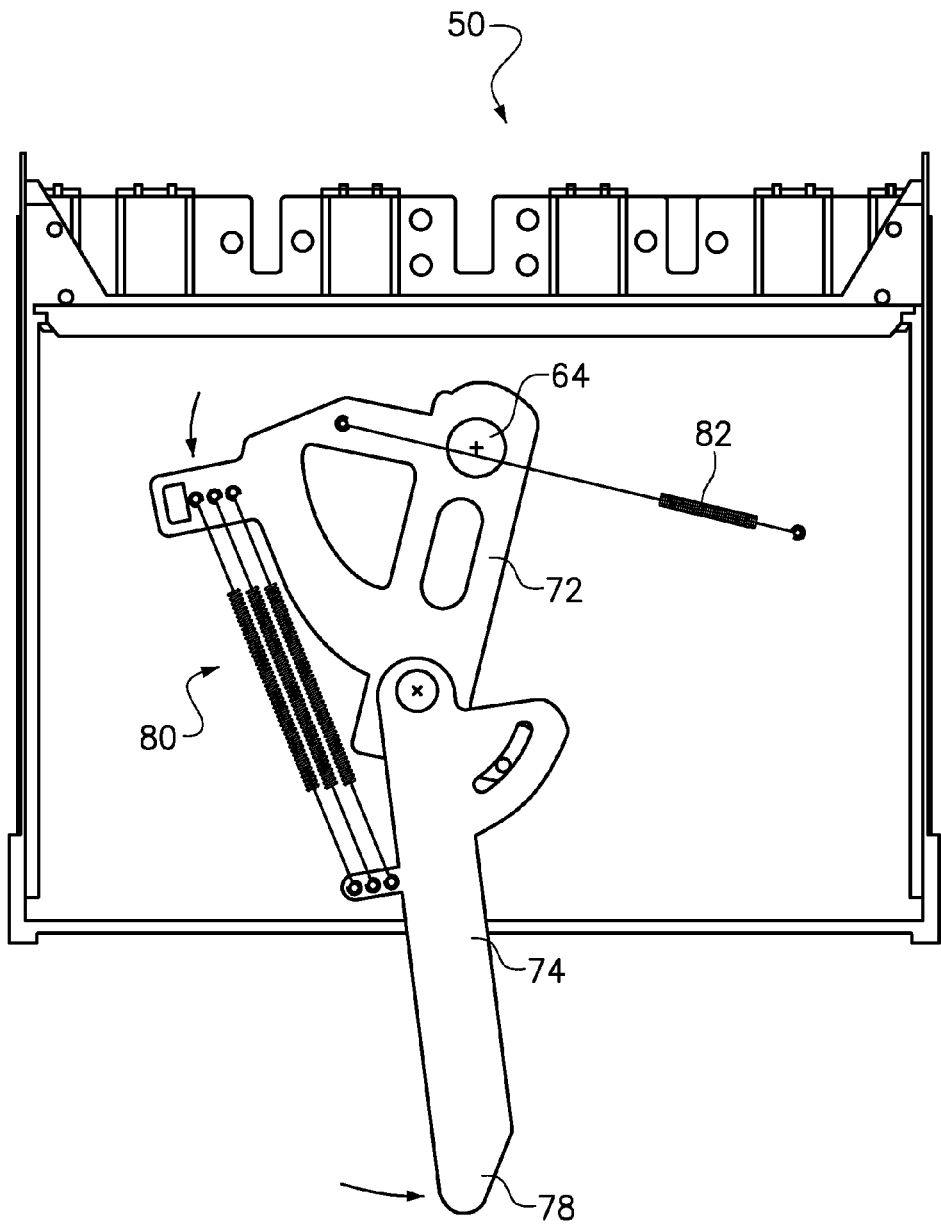
Figure 7D:
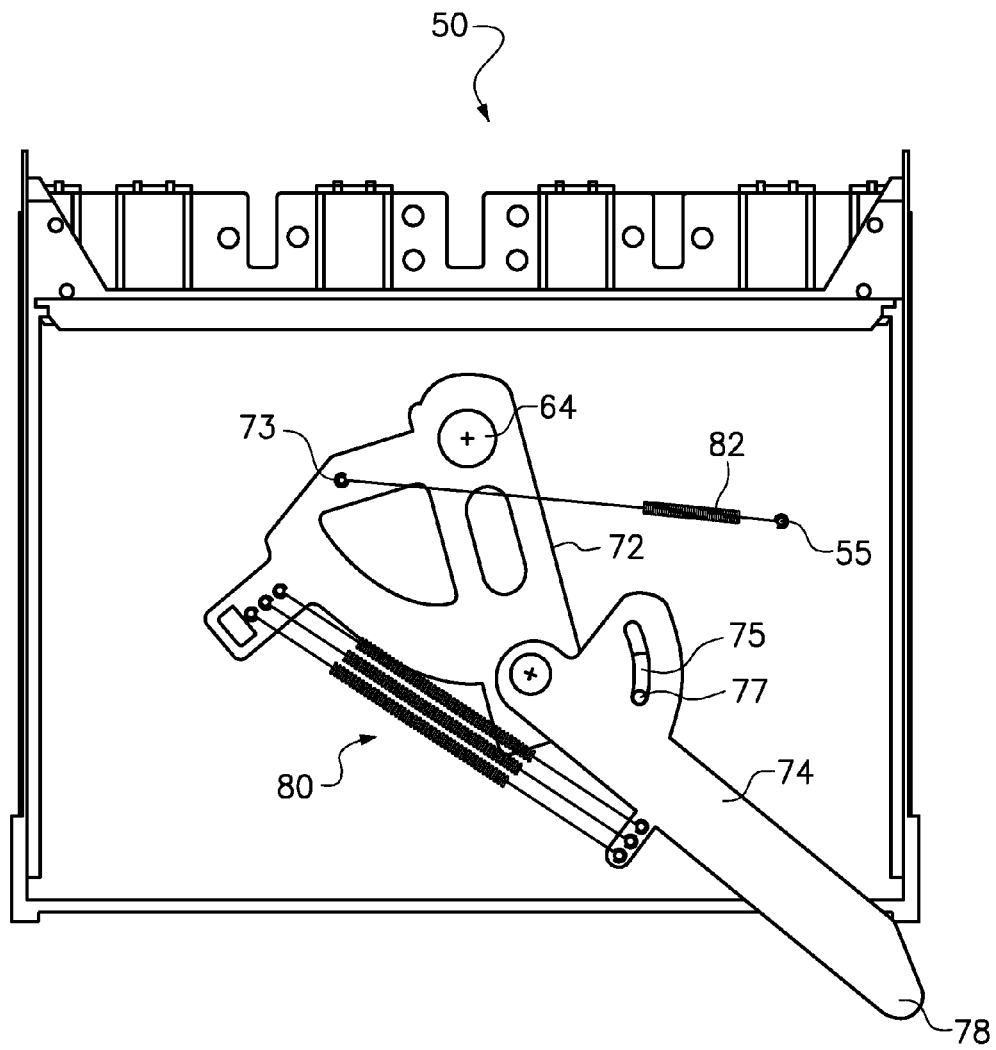

The distal link 74 is pivotally coupled to the proximal link 72 about a pivot (see pivot axis 76) and has a distal end 78 extending beyond an edge 56 of the module for manual actuation of the handle between an unlatched position (FIG. 7A) and a latched position (FIG. 7D). The distal link 74 and the proximal link 72 are further coupled by a spring (here, a spring assembly comprising three springs 80) for transmitting a controlled amount of torque from the distal link 74 to the proximal link 72 when the handle is moved toward the latched position (to the right as shown in FIG. 7A).

An over-center spring 82 has a first end coupled to the module at a stud 55 and a second end coupled to the proximal link at a pin 73. With the handle in the unlatched position as shown, the over-center spring 82 opposes rotation of the cam plate through a first range of rotation of the cam plate, but will contribute to rotation of the cam plate through a second range of rotation of the cam plate. FIG. 7A is a bottom view corresponding to the top view of FIGS. 4-5.

In FIG. 7B, a user (hand not shown) is pulling the distal end 78 of the distal link 74 toward the latched position (to the right). As shown, the distal link 74 has begun to rotate about pivot axis 76 relative to the proximal link 72, but the proximal link 72 has not yet rotated about pivot axis 64. Accordingly, the cam plate would not have rotated yet. However, the springs 80 transmit a torque from the distal link 74 to the proximal link 72 and have lengthened. Note that the distal link 74 has a slot 75 that receives a pin 77 from the proximal link 72 to limit the rotation of the distal link. As shown, the distal link 74 has traveled about half of its allowed rotation (i.e., the pin 77 is about in the middle of the slot 75).

In FIG. 7C, the user has pulled the distal end 78 of the distal link 74 further toward the latched position (to the right). As a result of the torque transmitted through the springs 80 from the distal link 74, the proximal link 72 has now rotated slightly about the pivot axis 64. In fact, the over-center spring 82 has lengthened and has just passed over-center (the pivot axis 64) such that the over-center spring 82 will now begin to bias the proximal link 72 toward the latched position (to the right). Accordingly, the forces in the springs 80 and the over-center spring 82 are both contributing to the amount of torque applied to the cam plate.

In FIG. 7D, the user has pulled the distal end 78 of the distal link 74 as far to the right (toward the latched position) as possible, such that the module is latched. Accordingly, FIG. 7D is a bottom view corresponding to the top view of FIG. 6. Due to the force necessary to reach this position, the distal link 74 has reached the full extent of its rotation relative to the proximal link. However, the over-center spring 82 now has a much larger lever arm, since its force vector (line between stud 55 and pin 73) has a much greater offset from the pivot axis 64. At this point, the user can release the distal link 74.

Figure 7E:
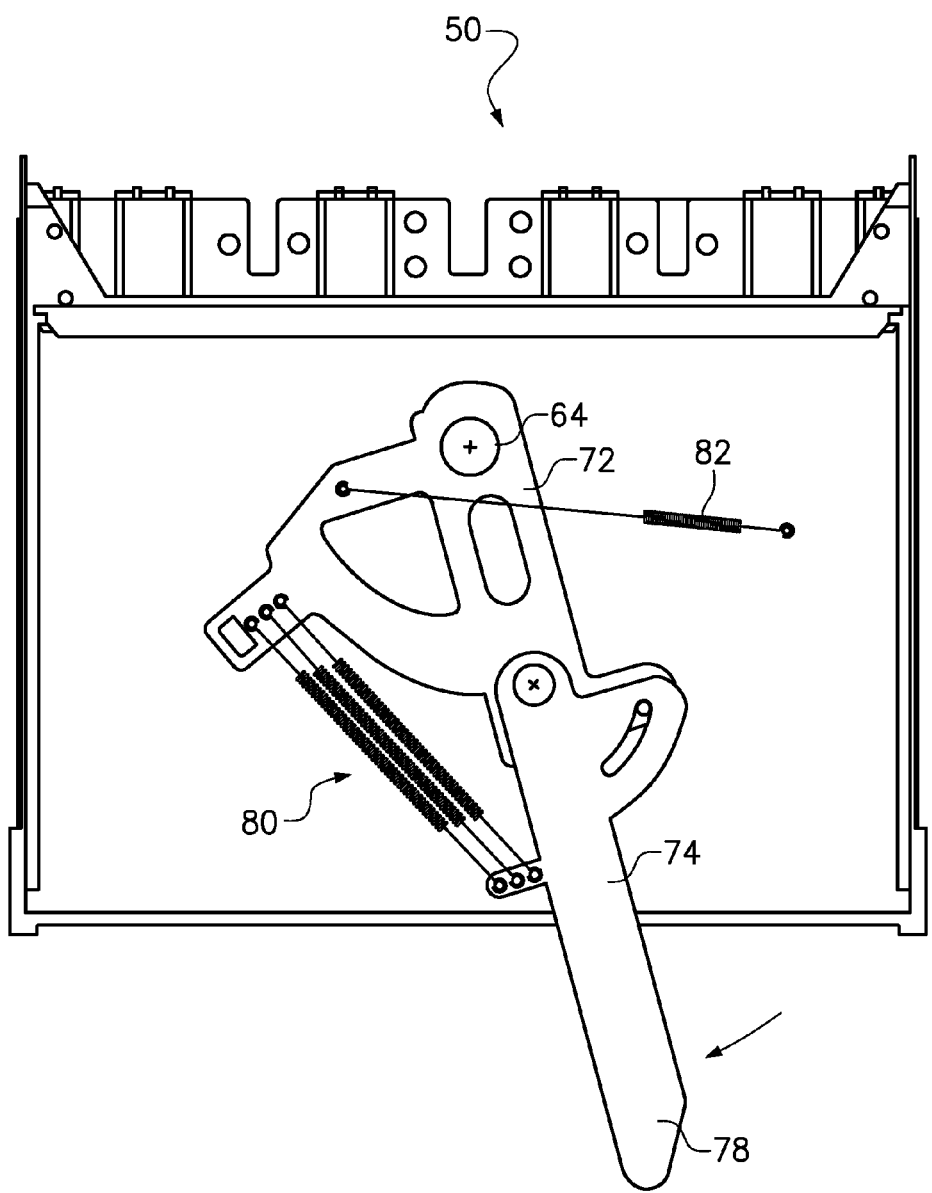

In FIG. 7E, the distal link 74 has moved a small distance back to the left to release the tension (shown in FIG. 7D) in the springs 80. However, the over-center spring 82 should now be able to hold the proximal link 72 in this position, and therefore keep the cam plate steady in the latched position.

With the distal link 74 in the position shown, the module 50 can be unlatched by the user moving the distal end 78 of the distal link 74 back to the right. This movement must overcome the force of the over-center spring 82 and rotate the proximal link 72 (and cam plate 62—not shown) clockwise at least until the over-center spring 82 has crossed back over the pivot axis 64 (See FIG. 7A). The module 50 may then be removed from the bay of the chassis.

Referring to FIGS. 7A-7E, the springs 80, 82 control the amount of torque that is applied to the cam plate. Specifically, the springs 80 that couple the distal and proximal links controls the amount of torque transmitted from the distal link to the proximal link. The spring force of the spring 80 and the lever arm of the spring relative to the pivot axis 76 combine to determine how much torque is applied to the proximal link. Of course, if the distal link is rotated about the pivot axis 76 to the full extent allowed by the pin 77 and slot 75, or other mechanical limit, then even greater torque can be applied to the proximal link. It should be appreciated that when the handle is manually actuated, all springs combine to drive the cam. Once the handle has reached the latched position and is released, only the over-center spring 82 continues to apply torque that keeps the cam plate in its current latched position. So, during the process of latching, the amount of torque applied to the cam plate increases in accordance with the combine force in the springs (to say 130 pounds force) and then during actuation against the hard stop. Then, when the latch handle is release, a residual torque (perhaps 30 pounds) of the over-center spring keeps the cam plate in the latched position. Although a simpler latch could be used to achieve and maintain a greater force (say a continuous 130 pounds torque), the thin midplane could suffer damage or distort such that the connectors are no longer functional. Furthermore, since the midplane couples with four orthogonal circuit boards, the total force would be 4×130=520 pounds. Rather, the total force applied by the present embodiment would be 4×30=120 pounds.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
   securing a midplane in a chassis, wherein the midplane has one or more connectors;
   securing a circuit board in a module, wherein the circuit board has one or more connectors secured along a leading edge of the circuit board for selectively connecting with the one or more connectors on the midplane;
   positioning the module so that the circuit board within the module is orthogonal to the midplane; and
   manually actuating a handle from the unlatched position to the latched position to rotate a cam plate and cause a cam surface of the cam plate to pull the circuit board toward the midplane and connect the one or more connectors on the circuit board with the one or more connectors on the midplane.

2. The method of claim 1, further comprising:
   fixedly coupling a latch arm to the midplane so that the latch arm extends toward the cam plate.

3. The method of claim 1, wherein the handle includes a proximal link and a distal link, further comprising:
   pivoting the distal link about a pivot coupling with the proximal link;
   controlling the amount of torque transmitted from the distal link to the proximal link using a spring; and
   pivoting the proximal link about a pivot axis orthogonal to the module to cause rotation of the cam plate.

4. The method of claim 1, further comprising:
securing the cam plate in a latched position with an over-center spring that biases the proximal link toward the latched position.

5. The method of claim 1, further comprising:
orthogonally coupling other circuit boards to a second side of the midplane.

6. The method of claim 1, wherein manually actuating the handle includes moving a distal end of the handle, wherein the distal end extends beyond an edge of the module.

7. The method of claim 1, further comprising:
transmitting signals through the connectors at a data rate between 25 and 40 gigabits per second.

\* \* \* \* \*